(12) United States Patent
Ayel

(10) Patent No.: US 12,199,117 B2
(45) Date of Patent: Jan. 14, 2025

(54) CHARGE OR A DISCHARGE OF AN OUTPUT VOLTAGE RAIL OF A PLURALITY OF PIXELS

(71) Applicant: Commissariat à l'Energie Atomique et aux Energies Alternatives, Paris (FR)

(72) Inventor: François Ayel, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/297,496

(22) Filed: Apr. 7, 2023

(65) Prior Publication Data

US 2023/0335567 A1 Oct. 19, 2023

(30) Foreign Application Priority Data

Apr. 13, 2022 (FR) ........................ 2203404

(51) Int. Cl.
*H01L 27/146* (2006.01)
*H04N 25/709* (2023.01)
(Continued)

(52) U.S. Cl.
CPC .. *H01L 27/14612* (2013.01); *H01L 27/14603* (2013.01); *H01L 27/14609* (2013.01);
(Continued)

(58) Field of Classification Search
CPC ......... H01L 27/14612; H01L 27/14603; H01L 27/14636; H01L 27/14609;
(Continued)

(56) References Cited

U.S. PATENT DOCUMENTS

| 7,847,846 B1 | 12/2010 | Ignjatovic et al. |
| 2018/0227518 A1* | 8/2018 | Ganguly ............... H04N 25/62 |
| 2020/0185441 A1* | 6/2020 | Ayel .................. H01L 27/14643 |

FOREIGN PATENT DOCUMENTS

| CN | 107426514 A | 12/2017 |
| CN | 111246136 A | 6/2020 |

(Continued)

OTHER PUBLICATIONS

Preliminary Search Report for French Application No. 2203404 dated Nov. 16, 2022, 1 page.

*Primary Examiner* — Jennifer D Bennett
*Assistant Examiner* — Erin R Garber
(74) *Attorney, Agent, or Firm* — Jordan IP Law, LLC

(57) ABSTRACT

The present description concerns a pixel array comprising one or a plurality of pixels (PIX1). Each pixel comprises a first transistor having its control node coupled to a photodiode, a first main conduction node coupled to a first output voltage rail (VS), and a second main conduction node coupled to a second voltage rail (VCS). The array comprises a variable impedance (404) coupling the first voltage rail (VS) to a first power supply rail (VDD) and a current source (402) coupling the second voltage rail (VCS) to a second power supply rail (GND), the variable impedance (404) being controlled based on a voltage on the second voltage rail (VCS). The array comprises a first switch (4002) coupling the second voltage rail (VCS) to a third voltage rail (VINIT1).

15 Claims, 3 Drawing Sheets

(51) Int. Cl.
  *H04N 25/766* (2023.01)
  *H04N 25/77* (2023.01)
  *H04N 25/778* (2023.01)
  *H04N 25/78* (2023.01)
(52) U.S. Cl.
  CPC ..... *H01L 27/14636* (2013.01); *H04N 25/709* (2023.01); *H04N 25/766* (2023.01); *H04N 25/77* (2023.01); *H04N 25/778* (2023.01); *H04N 25/78* (2023.01)
(58) Field of Classification Search
  CPC ........................ H01L 27/14643; H04N 25/778; H04N 25/78; H04N 25/709; H04N 25/77; H04N 25/766; H04N 25/76
  See application file for complete search history.

(56) References Cited

FOREIGN PATENT DOCUMENTS

| | | | |
|---|---|---|---|
| FR | 3089682 | A1 | 6/2020 |
| FR | 3100925 | A1 | 3/2021 |

\* cited by examiner

CHARGE OR A DISCHARGE OF AN OUTPUT VOLTAGE RAIL OF A PLURALITY OF PIXELS

FIELD

The present disclosure generally concerns the field of image sensors, and in particular, a pixel array and a pixel array control method.

BACKGROUND

In CMOS ("Complementary Metal Oxide Semiconductor") image sensors, generally a voltage level generated by a photodiode of a pixel of the sensor is read by using a transistor of the pixel assembled in a voltage follower configuration. This transistor for example has one of its conduction nodes coupled to a power supply rail, and its other conduction node coupled to an output line, for example, via a line selection transistor also called readout transistor. A current source is for example used to draw a current on the output line, and this enables to read the voltage present at the level of the gate of the voltage follower transistor.

SUMMARY

There exists a need for a CMOS image or light sensor and for a method of controlling the sensor overcoming all or part of the disadvantages of known CMOS image or light sensors and their known control methods.

An embodiment overcomes all or part of the disadvantages of known CMOS image or light sensors and of their known control methods.

An embodiment provides a pixel array, comprising:
one or a plurality of pixels, each comprising a first transistor having: its control node coupled to a photodiode; a first one of its main conduction nodes coupled to a first output voltage rail; and a second one of its main conduction nodes coupled to a second voltage rail;
a variable impedance coupling the first voltage rail to a first power supply rail of the pixel array;
a current source coupling the second voltage rail to a second power supply rail of the pixel array, the variable impedance being controlled based on a voltage on the second voltage rail; and
a first switch coupling the second voltage rail to a third voltage rail.

According to an embodiment, the pixel array further comprises a differential amplifier having a first input coupled to the second voltage rail, a second input coupled to a reference voltage, and an output coupled to a control input of the variable impedance.

According to an embodiment, the pixel array comprises a circuit configured to deliver the reference voltage and to modify the reference voltage at least according to temperature.

According to an embodiment, a voltage of the third voltage rail is configured so that a turning on of the first switch makes the variable impedance equivalent to an open circuit.

According to an embodiment, the pixel array further comprises a second switch coupling the first voltage rail to a fourth voltage rail.

According to an embodiment, the voltage of the fourth voltage rail is closer to a voltage on the second power supply rail than to a voltage on the first power supply rail.

According to an embodiment, each pixel further comprises a second transistor coupling the control node of the first transistor to a reset voltage rail, and a third transistor coupling the first conduction node of the first transistor to the first voltage rail.

According to an embodiment, a voltage of the reset voltage rail determines a value of the voltage of the fourth voltage rail.

According to an embodiment, each pixel further comprises a transfer gate coupling the control node of the first transistor to the photodiode.

An embodiment provides a method of controlling a pixel of a pixel array, the method comprising, for each operation of reading of the pixel, a turning on of a first switch coupling a second voltage rail to a third voltage rail, the second voltage rail being coupled to a second conduction node of a first transistor of the pixel having a first conduction node coupled to a first output voltage rail and a control node coupled to a photodiode of the pixel, the first voltage rail being coupled to a first power supply rail by a variable impedance and the second voltage rail being coupled to a second power supply rail by a current source, the variable impedance being controlled based on a voltage on the second voltage rail.

According to an embodiment, a voltage of the third voltage rail is configured so that a turning on of the first switch makes the variable impedance equivalent to an open circuit.

According to an embodiment:
each pixel further comprises a second transistor coupling the control node of the first transistor to a reset voltage rail, and a third transistor coupling the first conduction node of the first transistor to the first voltage rail; and
the turning on of the first switch is implemented before a period where the third transistor is held on.

According to an embodiment, a second switch couples a fourth voltage rail to the first voltage rail and is switched to the on state while the first switch is on.

According to an embodiment, a voltage of the reset voltage rail determines a value of the voltage of the fourth voltage rail.

According to an embodiment, the voltage of the fourth voltage rail is closer to a voltage on the second power supply rail than to a voltage on the first power supply rail.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the circuits for controlling the rows and the columns of pixels in such a pixel array have not been described in detail, such circuits being well known by those skilled in the art.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made, unless specified otherwise, to the orientation of the figures.

Unless specified otherwise, the expressions "around", "approximately", "substantially" and "in the order of" signify within 10%, and preferably within 5%.

Unless indicated otherwise, a voltage of a node or of a rail corresponds to the potential of this node or of this rail referenced to a reference potential, for example, ground potential GND.

Unless specified otherwise, a same reference may designate both a conductive rail and a voltage on this conductive rail.

Documents FR3089682 (B1), US2020185441 (A1), and CN111277775 (A) which are herein incorporated by reference within the limits provided by law, describe a pixel array of a CMOS image or light sensor.

Figure 1:
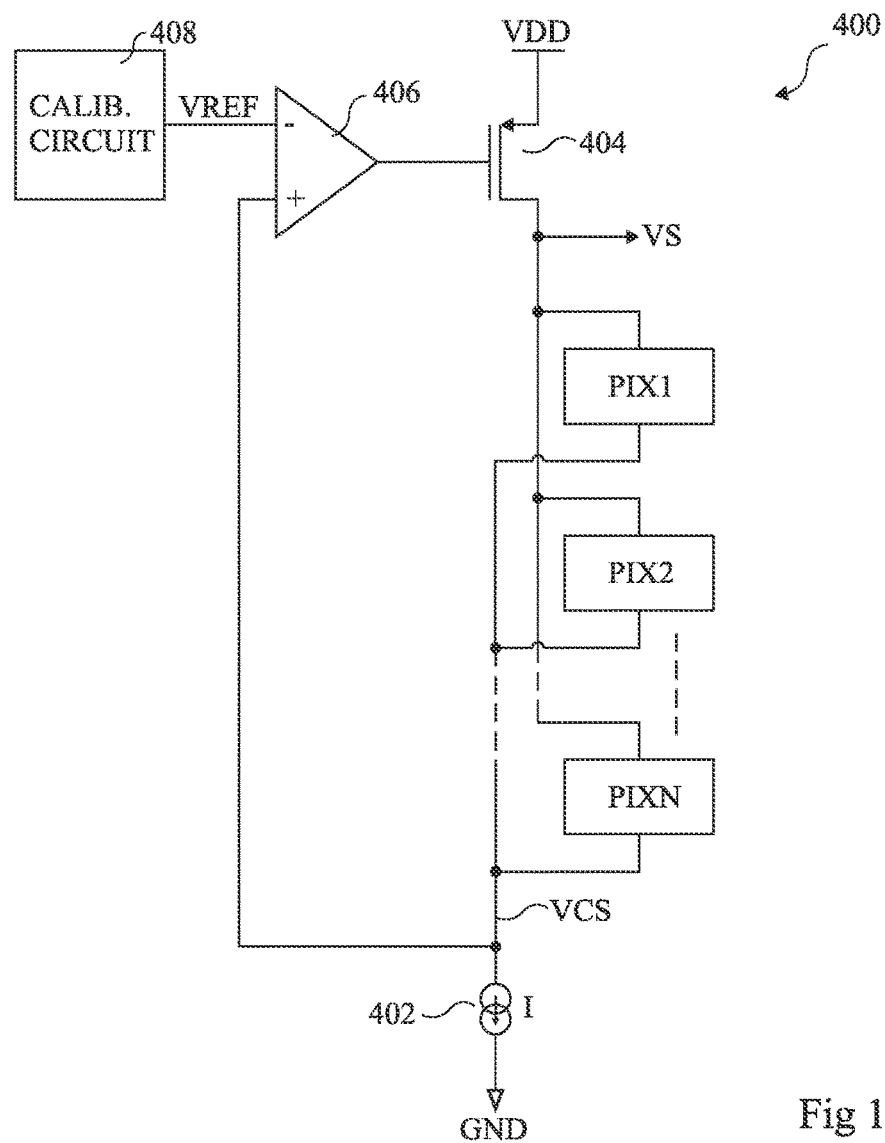
FIG. 1 illustrates an example of an image sensor.
Figure 4:
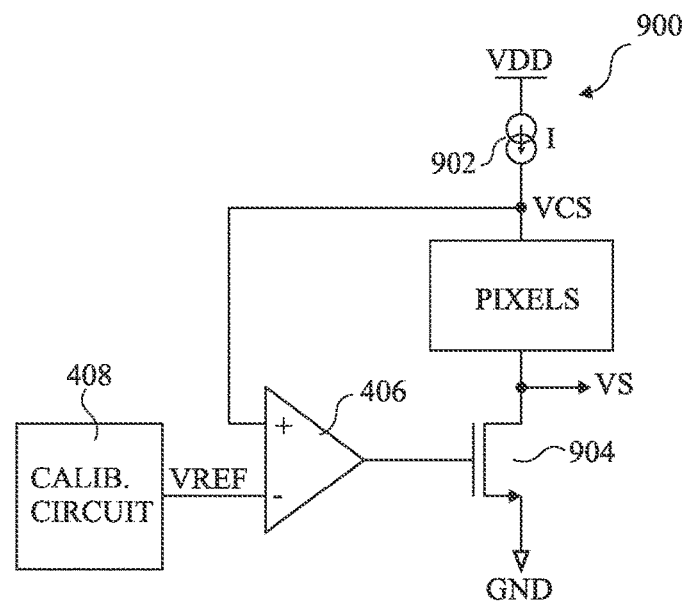
FIG. 4 illustrates another example of an image sensor.

FIG. 1 is a copy of FIG. 4 of the above-mentioned documents. More particularly, FIG. 1 schematically illustrates an example of a column 400 of a pixel array of an image or light sensor, which array may comprise a plurality of columns 400.

The column 400 of FIG. 1 for example comprises N pixel circuits PIX1 to PIXN, where N is for example equal to at least two. In other examples, column 400 may however comprise a single pixel circuit. Preferably, the N pixel circuits PIX1 to PIXN are identical to one another.

Each pixel circuit is coupled between an output voltage rail VS and another voltage rail VCS. In other words, each pixel circuit comprises a node connected to rail VS and a node connected to rail VCS.

Figure 2:
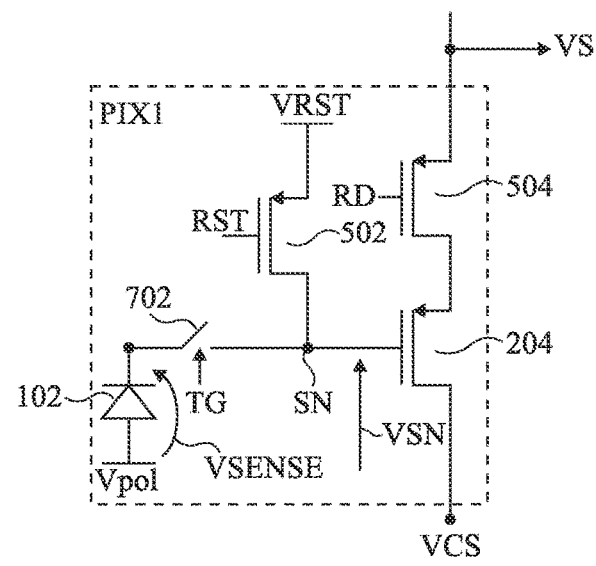
FIG. 2 illustrates an example of a pixel of the image sensor of FIG. 1.

FIG. 2 schematically illustrates an example of the pixel circuit PIX1 of FIG. 1, the other pixel circuits PIX2 to PIXN of FIG. 1 being, preferably, identical or similar to pixel circuit PIX1.

Pixel circuit PIX1 or, more simply, pixel PIX1, comprises a photodiode 102, for example, a pinned photodiode. Photodiode 102 has one of its electrodes, for example, its cathode, coupled to a detection node SN of the pixel. Photodiode 102 has, for example, the other of its electrodes coupled to a rail of a bias potential Vpol.

In FIG. 2, photodiode 102 is coupled to node SN by a transfer gate, represented by a switch 702. Transfer gate 702 is arranged between photodiode 102 and detection node SN. Transfer gate 702 is preferably connected to node SN. Transfer gate 702 is controlled by a signal TG, for example delivered by a circuit for controlling the sensor.

Pixel PIX1 comprises a MOS ("Metal Oxide Semiconductor") transistor 204 having its control node (gate) connected to node SN, and arranged to operate as a voltage follower. Transistor 204 has one of its conduction nodes, for example, its drain, coupled, preferably connected, to rail VCS, and the other of its conduction nodes, for example, its source, coupled to rail VS.

Transistor 204 is coupled to rail VS by a readout MOS transistor 504 controlled by a readout signal RD, for example delivered by a circuit for controlling the sensor. For example, transistor 504 has one of its conduction nodes, for example, its source, connected to rail VS, and the other of its conduction nodes, for example its drain, connected to transistor 204, for example to the source of transistor 204.

Pixel PIX1 further comprises a MOS transistor 502 for resetting node SN. Transistor 502 is controlled by a signal RST, for example delivered by a circuit for controlling the sensor. Transistor 502 is coupled by its conduction nodes between node SN and a reset voltage rail VRST.

In the example of FIG. 2, transistors 502, 204, and 504 have a P channel (PMOS). Thus, potential VRST is a low potential, for example, a potential closer to a low power supply potential than to a high power supply potential of column 400 (FIG. 1). Transistor 502 for example has its source coupled, preferably connected, to rail VRST and its drain coupled, preferably connected, to node SN. Potential Vpol is for example ground potential GND.

Referring again to FIG. 1, a current source 402 couples rail VCS to a low power supply rail configured to receive the low power supply potential, for example, ground potential GND. Current source 402 is configured to deliver a current I, preferably constant. For example, a terminal of current source 402 is connected to rail VCS, the other terminal of current source 402 being connected to low power supply rail GND.

Further, a variable impedance 404 couples rail VS to a high power supply rail configured to receive high power supply potential Vdd. Variable impedance 404 is controlled by a differential amplifier 406. Variable impedance 404 is for example implemented by a PMOS transistor in the example of FIG. 1 where the pixels have P-channel transistors 204. Variable impedance 404 for example has a conduction terminal connected to rail VS and another conduction terminal connected to power supply rail VDD. For example, potential supply potential VDD is high with respect to low power supply potential GND.

Differential amplifier 406 controls variable impedance 404 based on the voltage on voltage rail VCS. In the example of FIG. 1, differential amplifier 406 has one of its inputs, in this example its positive input, coupled to voltage rail VCS and its other input, in this example its negative input, coupled to a circuit 408 (block "CALIB. CIRCUIT" in FIG. 1), which delivers a reference voltage VREF. For example, reference voltage VREF is a voltage which varies at least according to temperature to ensure a temperature compensation. In alternative embodiments, reference voltage VREF might be fixed, or might depend on other parameters such as the manufacturing method, the power supply voltage, or the voltage of voltage rail VS.

During an operation of reading of a pixel of column 400, the pixel transistor 504 (FIG. 2) is set to the on state while the transistors 504 of the other pixels of column 400 (FIG. 1) are held in the off state. When pixel transistor 504 is in the on state, a voltage VSN of node SN of the pixel determines a voltage on rail VS. A reading of the voltage of node SN then corresponds to a storage or to a sampling of the voltage on rail VS, for example, on a sampling capacitor (not illustrated). A terminal of the sampling capacitor is for example coupled to rail VS, for example, by a switch. Another terminal of the sampling capacitor is for example coupled to power supply rail GND.

A correlated double sampling (CDS) is implemented during the pixel reading operation. For example, a first voltage of rail VS determined by a reset level of node SN is stored or sampled, for example, on a first sampling capacitor, during a reading of the reset level of node SN, and a second voltage of rail VS determined by a signal level of node SN is stored, for example, on a second sampling capacitor, during a reading of the signal level of node SN. Thus, the operation of reading of a pixel by implementing a correlated double sampling comprises a reading of the reset level of node SN, followed by a reading of the signal level of node SN.

The reset level of node SN for example corresponds to the voltage VSN of node SN at the end of a reset phase of node SN. A reset phase is for example implemented by switching transistor 502 to the on state, and ends, for example, by switching transistor 502 to the off state.

The signal level of node SN for example corresponds to the voltage VSN of node SN when the latter is determined by a quantity of light received by the pixel during an integration period. For example, the signal level of node SN corresponds to the voltage VSN of node SN after transfer gate 702 has been successively switched to the on state and then to the off state while transistor 502 is in the off state.

Figure 3:
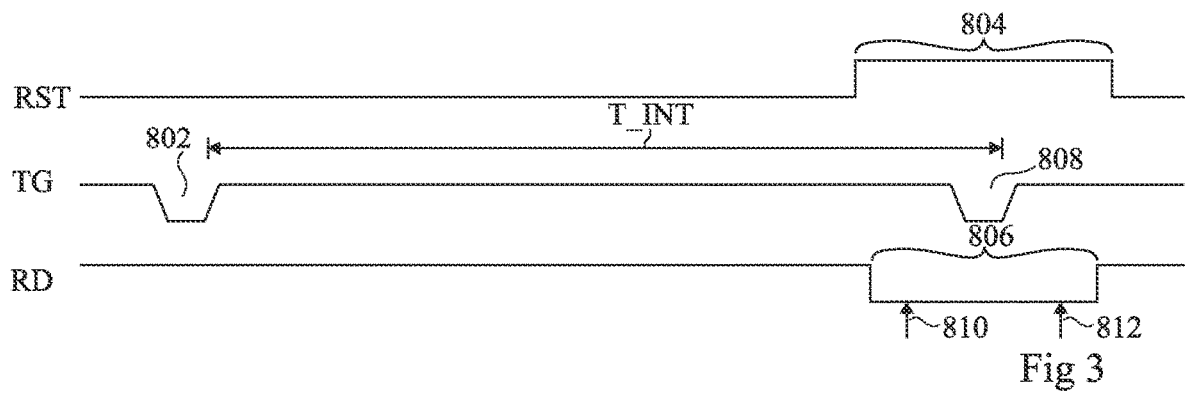
FIG. 3 illustrates an example of operation of the sensor of FIG. 1.

FIG. 3 is a timing diagram illustrating an example of the time characteristics of signals in the pixel circuit of FIG. 2, and in particular the time characteristics of signals RST, TG, and RD. In the example of FIG. 3, voltage VSN and VS are not illustrated.

Signal RST is initially in a state, for example, in the low state in this example where transistor 502 has a P channel, so that detection node SN is coupled to voltage VRST (transistor 502 on). This corresponds to a phase of resetting of node SN, for example, to a low level. While node SN is coupled to voltage VRST, a pulse 802 of signal TG, for example, to the low state in this example where the pixel transistors have a P channel, causes the setting to the on state of transfer gate 702 and the resetting of a voltage VSENSE across photodiode 102. The end of pulse 802 marks the beginning of an integration period T_INT.

For each pixel reading operation, reset signal RST is taken to a state, for example, the high state in this example where transistor 502 has a P channel, during a period 804 to isolate detection node SN from rail VRST (transistor 502 in the off state). This marks the end of the reset phase of node SN.

During period 804, readout signal RD is taken to a state, for example, the low state in this example where transistor 504 has a P channel, for a period 806 so that transistor 504 is on and voltage VS is determined by the voltage VSN of node SN.

During period 806, a pulse 808 of signal TG, for example, to the low state, causes the setting to the on state of transfer gate 702 and the transfer of charges from photodiode 102 to node SN, whereby, in this example, the voltage VSN of node SN increases. The end of pulse 808 marks the end of integration period T_INT.

As show by arrows 810 and 812, a correlated double sampling is implemented during the read operation (period 806), by sampling the voltages on rail VS, for example, with sampling capacitors, before and after the pulse 808 of signal TG. The sampling of voltage VS before pulse 808 enables to capture the reset level of node SN, and the sampling of voltage VS after pulse 808 enables to capture the signal level of node SN. The signal level of node SN is determined by the value of voltage VSENSE at the end of integration period T_INT, that is, at the end of pulse 808, and thus by the quantity of charges photogenerated in the pixel during period T_INT.

In the example described in relation with FIGS. 1, 2, and 3, the reset level of node SN is a low level and the signal level of node SN is a high level. As an example, the signal level is a high level with respect to the low reset level of node SN.

The previously-described FIGS. 1, 2, and 3 concern examples where the voltage follower transistor 204 of the pixels is a PMOS transistor and, where, more generally, the transistors of the pixel have a P channel. However, in other examples, this voltage follower transistor is an NMOS transistor and, more generally, the transistors of the pixel have an N channel as will now be illustrated in FIGS. 4 and 5.

FIG. 4 is a copy of the drawing numbered 9 of the above-mentioned documents. More particularly, FIG. 4 schematically illustrates a column 900 of an array of pixels of an image sensor according to another example of embodiment. Although this is not illustrated in FIG. 4, the pixel array may comprise a plurality of columns 900. Further, in the same way as for a column 400, column 900 may comprise one or a plurality of pixels (block "PIXELS" in FIG. 4), each connected between rail VCS and rail VS, and being preferably identical to one another.

The example of FIG. 4 is similar to that of FIG. 1, except that the voltage follower transistor located in each pixel (not illustrated in FIG. 4) is implemented by an NMOS transistor rather than by a PMOS transistor.

Thus, the current source 402 of FIG. 1 is replaced with a current source 902 arranged between voltage rail VCS and high power supply rail VDD. Current source 902 is configured to deliver a current I, preferably constant. For example, a terminal of current source 902 is connected to rail VCS, the other terminal of current source 902 being connected to high power supply rail VDD.

Further, instead of the variable impedance 404 of FIG. 1, a variable impedance 904 is arranged between voltage output rail VS and low power supply rail GND, and is controlled by differential amplifier 406. Variable impedance 904 is for example implemented by an NMOS transistor. Variable impedance 904 for example has a conduction terminal connected to rail VS and another conduction terminal connected to low power supply rail GND.

Figure 5:
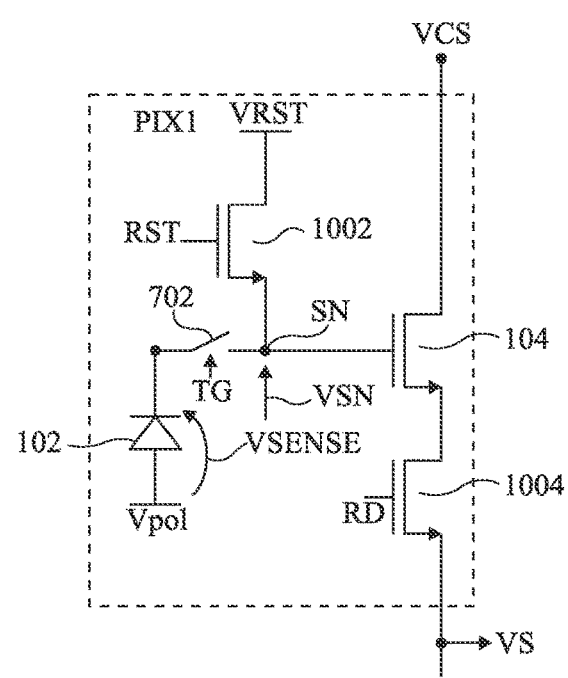
FIG. 5 illustrates an example of a pixel of the sensor of FIG. 4.

FIG. 5 schematically illustrates an example of a pixel of the pixel array of FIG. 4, this pixel bearing reference PIX1 in FIG. 5. The other pixels of FIG. 4 are preferably implemented identically or similarly to this pixel PIX1.

The pixel PIX1 of FIG. 5 differs from the pixel PIX1 previously described in relation with FIG. 2 in that:

PMOS transistor 204 is replaced with an NMOS transistor 104,

PMOS transistor 502 is replaced with an NMOS transistor 1002, and

PMOS transistor 504 is replaced with an NMOS transistor 1004.

More particularly, transistor 104 is arranged to operate as a voltage follower. A main conduction node of transistor 104, for example, its source, is coupled to rail VS by transistor 1004 and the other main conduction node of transistor 104, for example, its drain, is coupled, preferably connected, to rail VCS. Transistor 1004 has one of its conduction nodes, for example its source, connected to rail VS, and the other of its conduction nodes, for example, its drain, connected to transistor 104, for example, to the source of transistor 104.

In the example of FIG. 5, transistors 104, 1002, and 1004 have an N channel (NMOS). Thus, potential VRST is a high potential, for example, a potential closer to high power supply potential VDD than to low power supply potential GND. Transistor 1002 has for example is source coupled, preferably connected, to node SN, and its drain coupled, preferably connected, to rail VRST. As an example, potential Vpol is equal or substantially equal to ground potential GND.

The operation of the pixel of FIG. 5 is for example similar to that of the pixel of FIG. 2, except that control signals RD and RST are adapted to take into account the use of NMOS transistors instead of PMOS transistors, for example, by inverting the high and low levels of these signals.

Thus, in the example described in relation with FIGS. 4 and 5, the reset level of node SN is a high level and the signal level of node SN is a low level. As an example, the signal level is a low level with respect to the high reset level of node SN.

In the previous examples where voltage follower transistor 204 is a PMOS transistor, impedance 404 and its control loop enable to accelerate the charge of rail VS between the beginning of pulse 808 and time 812 of storage of the voltage VS corresponding to the signal level of node SN. In other words, impedance 404 and its control loop enable to decrease the settling time of a rising signal on rail VS caused by pulse 808, before the reading of the signal level of node SN. However, the discharge speed of rail VS between the beginning of period 806 and time 810 of storage of the voltage VS corresponding to the reset level of node SN remains limited by the value of current I and the capacitance value of rail VS. In other words, the settling time of a falling signal on rail VS caused by the setting to the on state of readout transistor 504 (FIG. 2) remains limited by the value of current I and the capacitance value of rail VS. For example, after the setting to the on state of readout transistor 504 while node SN is at its reset level, which is a low level, the time necessary for the voltage of rail VS to decrease to a steady value determined by the reset level of node SN increases with the capacitance value of rail VS and with the amplitude of the difference between the value of voltage VS at the beginning of period 806 and the steady value determined by the reset level, which increases the time necessary for the reading of the reset level of node SN.

It would be desirable to decrease the time necessary for the reading of a reset level of the node SN of a pixel having a voltage follower transistor 204 of PMOS type.

Similarly, in the previous examples where the voltage follower transistor is an NMOS transistor, impedance 904 and its control loop enable to accelerate the discharge of rail VS between the beginning of pulse 808 and time 812 of storage of the voltage VS corresponding to the signal level of node SN. In other words, impedance 904 and its control loop enable to decrease the settling time of a falling signal on rail VS caused by pulse 808, before the reading of the signal level of node SN. However, the charge speed of rail VS between the beginning of period 806 and time 810 of storage of the voltage VS corresponding to the reset level of node SN remains limited by the value of current I and the capacitance value of rail VS. In other words, the settling time of a rising signal on rail VS caused by the setting to the on state of readout transistor 1004 (FIG. 5) remains limited by the value of current I and the capacitance value of rail VS. For example, after the setting to the on state of readout transistor 1004 while node SN is at its reset level, which is a high level, the time necessary for the voltage of rail VS to increase up to a steady value determined by the reset level of node SN increases with the capacitance value of rail VS and with the amplitude of the difference between the value of voltage VS at the beginning of period 806 and the steady value determined by the reset level, which increases the time necessary for the reading of the reset level of node SN.

It would be desirable to decrease the time necessary for the reading of a reset level of the node SN of a pixel having a voltage follower transistor 104 of NMOS type.

Figure 6:
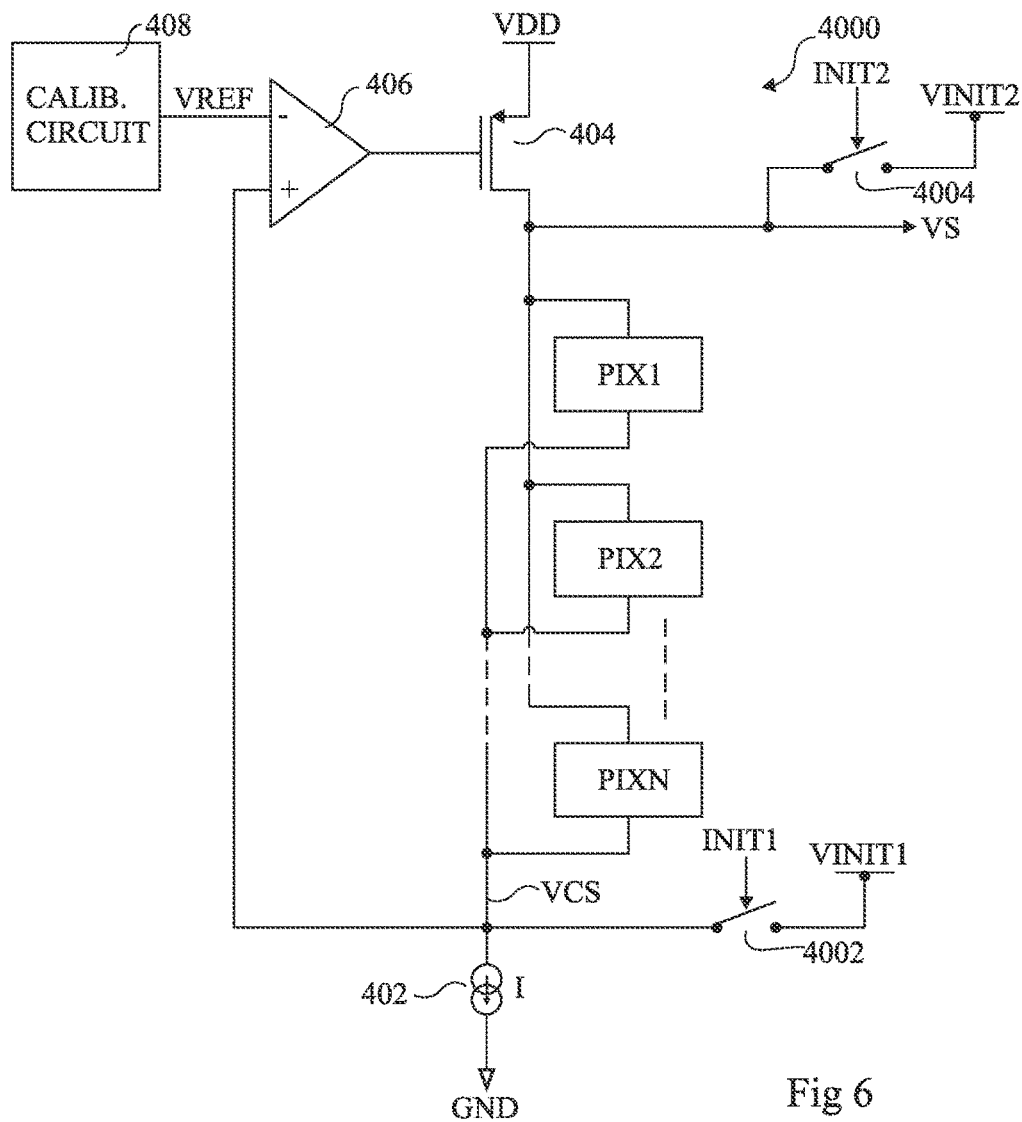
FIG. 6 illustrates an embodiment of an image sensor.

FIG. 6 schematically illustrates an embodiment of a column 4000 of a pixel array of an image or light sensor, which array may comprise a plurality of columns 4000.

The column 4000 of pixels comprises many elements in common with the column 400 described in relation with FIG. 1. Thus, unless otherwise indicated, what has been described for column 400 applies to column 4000, and only the differences between column 400 and column 4000 are highlighted. In particular, in column 4000, the pixels have PMOS-type transistors 204. For example, all the pixels of column 4000 are such as described in relation with FIG. 2.

Column 4000 differs from column 400 in that it comprises a switch 4002 coupling voltage rail VCS to a voltage rail VINIT1.

Switch 4002 has a conduction terminal coupled, preferably connected, to rail VCS, and another conduction terminal coupled, preferably connected, to rail VINIT1. Switch 4002 is controlled by a signal INIT1, for example, delivered by a circuit for controlling the sensor. As an example, switch 4002 is implemented by a MOS transistor.

Voltage VINIT1 is configured so that, when rail VCS is forced to voltage VINIT1 by a turning on of switch 4002, impedance 404 is equivalent to an open circuit. This enables to isolate rail VS from power supply rail VDD. Voltage VINI1 is thus here greater than voltage VREF.

According to an embodiment, for each pixel reading operation, switch 4002 is switched to the on state before the beginning of the period 806 during which transistor 504 (FIG. 2) is on.

Column 4000 further comprises a switch 4004 coupling voltage rail VS to a voltage rail VINIT2. Switch 4004 has a conduction terminal coupled, preferably connected, to rail VS, and another conduction terminal coupled, preferably connected, to rail VINIT2. Switch 4004 is controlled by a signal INIT2, for example, delivered by a circuit for controlling the sensor. As an example, switch 4004 is implemented by a MOS transistor.

For each pixel reading operation, while rail VCS is forced to voltage VINIT1 (switch 4002 on and impedance 404 equivalent to an open circuit), rail VS is forced to voltage VINIT2 by a turning on of switch 4004 before the beginning of the period 806 during which transistor 504 (FIG. 2) is on. The value of voltage VINIT2 is low, that is, closer to the voltage on low power supply rail GND than to the voltage on high power supply rail VDD. For example, voltage VINIT2 has a value substantially equal and for example lower than a steady value of the voltage VS determined by the reset level of node SN. In other words, voltage VINIT2 is for example determined by voltage VRST.

Once rail VS has been forced to voltage VINIT2, the two switches 4002 and 4004 are switched to the off state. More particularly, at least switch 4004 is switched to the off state before the beginning of period 806, for example between the beginning of period 804 and the beginning of period 806, switch 4002 being switchable to the off state later, for example during period 806 and before time 810.

Forcing voltage VINIT2 on rail VS before the beginning of period 806 enables to at least partly discharge rail VS. This enables to decrease the settling time of voltage VS during the reading of the reset level of node SN.

Figure 7:
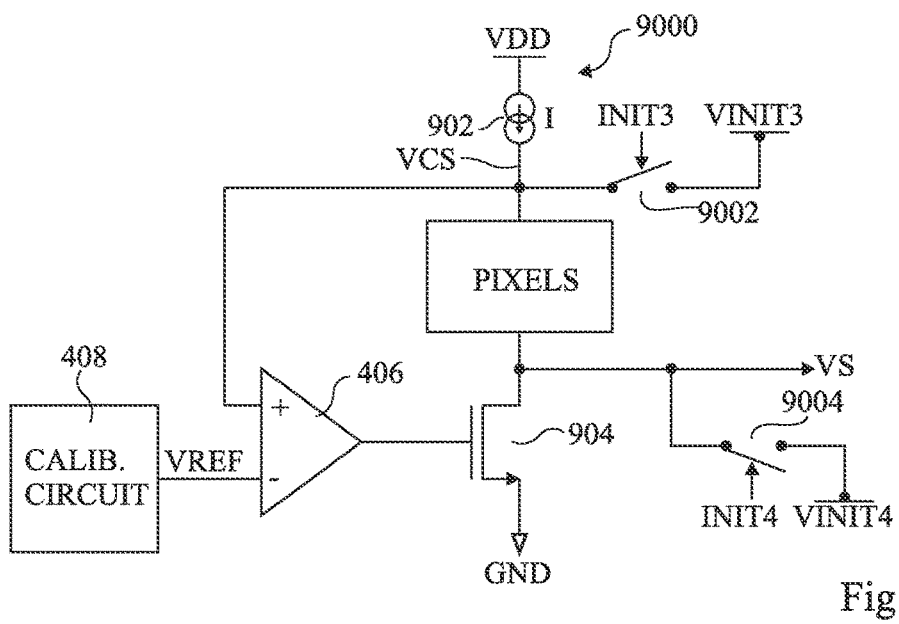
FIG. 7 illustrates another embodiment of an image sensor.

FIG. 7 schematically illustrates another embodiment of a column 9000 of a pixel array of an image or light sensor, which array may comprise a plurality of columns 9000.

The column 9000 of pixels comprises many elements in common with the column 900 described in relation with FIG. 4. Thus, unless otherwise indicated, what has been described for column 900 applies to column 9000, and only the differences between column 900 and column 9000 are highlighted. In particular, in column 9000, the pixels have NMOS-type transistors 104. For example, all the pixels of column 9000 are such as described in relation with FIG. 5.

Column 9000 differs from column 900 in that it comprises a switch 9002 coupling voltage rail VCS to a voltage rail VINIT3.

Switch 9002 has a conduction terminal coupled, preferably connected, to rail VCS, and another conduction terminal coupled, preferably connected, to rail VINIT3. Switch 9002 is controlled by a signal INIT3, for example, delivered by a circuit for controlling the sensor. As an example, switch 9002 is implemented by a MOS transistor.

Voltage VINIT3 is configured so that, when rail VCS is forced to voltage VINIT3 by a turning on of switch 9002, impedance 904 is equivalent to an open circuit. This enables to isolate rail VS from power supply rail GND. Voltage VINIT3 is thus here lower than voltage VREF.

According to an embodiment, for each pixel reading operation, switch 9002 is switched to the on state before the beginning of period 806 during which pixel transistor 104 (FIG. 5) is on.

Column 9000 further comprises a switch 9004 coupling voltage rail VS to a voltage rail VINIT4. Switch 9004 has a conduction terminal coupled, preferably connected, to rail VS, and another conduction terminal coupled, preferably connected, to rail VINIT4. Switch 9004 is controlled by a signal INIT4, for example, delivered by a circuit for controlling the sensor. As an example, switch 9004 is implemented by a MOS transistor.

For each pixel reading operation, while rail VCS is forced to voltage VINIT3 (switch 9002 on and impedance 904 equivalent to an open circuit), rail VS is forced to voltage VINIT4 by a turning on of switch 9004 before the beginning of the period 806 during which the pixel transistor 104 (FIG. 5) is on. The value of voltage VINIT4 is high, that is, it is closer to the voltage of high power supply rail VDD than to the voltage of low power supply rail GND. For example, voltage VINIT4 has a value substantially equal and for example lower than a steady value of the voltage VS determined by the reset level of node SN. In other words, voltage VINIT4 is for example determined by voltage VRST.

Once rail VS has been forced to voltage VINIT4, the two switches 9002 and 9004 are switched to the off state. More particularly, at least switch 9004 is switched to the off state before the beginning of period 806, for example between the beginning of period 804 and the beginning of period 806, switch 9002 being switchable to the off state later, for example during period 806 and before time 810.

Forcing voltage VINIT4 on rail VS before the beginning of period 806 enables to at least partly charge rail VS. This enables to decrease the settling time of voltage VS during the reading of the reset level of node SN.

Various embodiments and different variants have been described. Those skilled in the art will understand that certain elements of these embodiments may be combined and other variants will readily occur to those skilled in the art.

For example, although two specific examples of pixels have been described, it will readily occur to those skilled in the art that the principles described herein may apply to any pixel circuit enabling to implement a correlated double sampling, for example, pixels each comprising a follower transistor having its gate connected to a detection node of the pixel, the detection node being connected to a transfer gate coupling the detection node to a photodiode.

Further, although in the examples described herein, variable impedances 404, 904 are implemented by transistors, in alternative embodiments, they may be implemented by other devices, such as variable resistors.

Although circuits comprising a low power supply rail at ground potential GND have been described, it will occur to those skilled in the art that the potential of the low power supply rail may be different from ground potential GND, for example be at a negative potential with respect to ground GND.

Further, those skilled in the art are capable of selecting a potential Vpol different from ground GND, and more generally of adapting the connection direction of photodiode PD, for example, to ensure that photodiode PD is pinned.

Although there has been described in relation with FIG. 3 an example of control of a pixel where the reset transistor 502 or 1002 of node SN is switched to the off state before the setting to the on state of readout transistor 504 or 1004, those skilled in the art are capable of adapting the description made hereabove of embodiments to the case where the reset transistor 502 or 1002 of node SN is switched to the off state after the setting to the on state of readout transistor 504 or 1004, but before time 810 of storage of the signal level of node SN.

Finally, the practical implementation of the described embodiments and variations is within the abilities of those skilled in the art based on the functional indications given hereabove. In particular, the selection of voltages Vpol, VREF, VINIT1, VINIT2, VINIT3, and VINIT4 is within the abilities of those skilled in the art.

What is claimed is:

1. Pixel array, comprising: —a plurality of pixels, each comprising a first transistor having: its control node coupled to a photodiode; a first one of its main conduction nodes coupled to a first output voltage rail; and a second one of its main conduction nodes coupled to a second voltage rail; —a variable impedance coupling the first voltage rail to a first power supply rail of the pixel array; —a current source coupling the second voltage rail to a second power supply rail of the pixel array, the variable impedance being controlled based on a voltage on the second voltage rail; and —a first switch coupling the second voltage rail to a third voltage rail; and —a second switch coupling the first voltage rail to a fourth voltage rail.

2. The pixel array according to claim 1, further comprising a differential amplifier having a first input coupled to the second voltage rail, a second input coupled to a reference voltage, and an output coupled to a control input of the variable impedance.

3. The pixel array according to claim 2, comprising a circuit configured to deliver the reference voltage and to modify the reference voltage at least according to temperature.

4. The pixel array according to claim 1, wherein a voltage of the third voltage rail is configured so that a turning on of the first switch makes the variable impedance equivalent to an open circuit.

5. The pixel array according to claim 1, wherein a voltage of the fourth voltage rail is closer to a voltage on the second power supply rail than to a voltage on the first power supply rail.

6. The pixel array according to claim 1, wherein each pixel further comprises a second transistor coupling the control node of the first transistor to a reset voltage rail, and a third transistor coupling the first conduction node of the first transistor to the first voltage rail.

7. The pixel array according to claim 6, wherein: a voltage of the reset voltage rail determines a value of a voltage of the fourth voltage rail.

8. The pixel array according to claim 1, wherein each pixel further comprises a transfer gate coupling the control node of the first transistor to the photodiode.

9. Method of controlling a pixel of a plurality of pixels of a pixel array, wherein:
each pixel of the plurality of pixels comprises a first transistor having: its control node coupled to a photodiode; a first one of its main conduction nodes coupled to a first output voltage rail; and a second one of its main conduction nodes coupled to a second voltage rail;
a variable impedance couples the first voltage rail to a first power supply rail of the pixel array;
a current source couples the second voltage rail to a second power supply rail of the pixel array, the variable impedance being controlled based on a voltage on the second voltage rail; and
a first switch couples the second voltage rail to a third voltage rail; and
a second switch coupling the first voltage rail to a fourth voltage rail,
and wherein the method comprises, for each operation of reading of the pixel of the plurality of pixels, a turning on of the first switch.

10. Pixel array comprising:
a pixel comprising a first transistor having: a control node coupled to a photodiode; a first main conduction node coupled to a first output voltage rail; and a second main conduction node coupled to a second voltage rail, the pixel further comprising a second transistor coupling the control node of the first transistor to a reset voltage rail, and a third transistor coupling the first main conduction node of the first transistor to the first output voltage rail;
a variable impedance coupling the first output voltage rail to a first power supply rail of the pixel array;
a current source coupling the second voltage rail to a second power supply rail of the pixel array, the variable impedance being controlled based on a voltage on the second voltage rail; and
a first switch coupling the second voltage rail to a third voltage rail,
wherein the pixel array further comprises a control circuit configured, for each operation of reading of the pixel, to turn on the first switch before a period during which the third transistor of said pixel is held on.

11. Method of controlling a pixel of a pixel array, the method comprising, for each operation of reading of the pixel, a turning on of a first switch coupling a second voltage rail to a third voltage rail, the second voltage rail being coupled to a second conduction node of a first transistor of the pixel having a first conduction node coupled to a first output voltage rail and a control node coupled to a photodiode of the pixel, the first voltage rail being coupled to a first power supply rail by a variable impedance and the second voltage rail being coupled to a second power supply rail by a current source, the variable impedance being controlled based on a voltage on the second voltage rail, wherein:
the pixel further comprises a second transistor coupling the control node of the first transistor to a reset voltage rail, and a third transistor coupling the first conduction node of the first transistor to the first voltage rail; and
the turning on of the first switch is implemented before a period during which the third transistor is held on.

12. The method according to claim 11, wherein a voltage of the third voltage rail is configured so that the turning on of the first switch makes the variable impedance equivalent to an open circuit.

13. The method according to claim 11, wherein a second switch couples a fourth voltage rail to the first voltage rail and is switched to an on state while the first switch is on.

14. The method according to claim 13, wherein a voltage of the reset voltage rail determines a value of a voltage of the fourth voltage rail.

15. The method according to claim 13, wherein a voltage of the fourth voltage rail is closer to a voltage on the second power supply rail than to a voltage on the first power supply rail.

* * * * *